United States Patent

Schlegel et al.

[15] 3,644,804

[45] Feb. 22, 1972

[54] TIME DELAY IGFETS

[72] Inventors: Earl S. Schlegel; George L. Schnable, both of Lansdale, Pa.

[73] Assignee: General Instrument Corporation, Newark, N.J.

[22] Filed: Nov. 28, 1969

[21] Appl. No.: 880,644

[52] U.S. Cl. ....................................317/235 R, 317/235 B
[51] Int. Cl. ....................................................H01l 11/14
[58] Field of Search................................................317/235

[56] References Cited

UNITED STATES PATENTS

| | | | |
|---|---|---|---|
| 3,355,598 | 11/1967 | Tuska | 317/235 |
| 3,374,406 | 3/1968 | Wallmark | 317/235 |
| 3,413,573 | 11/1968 | Nathanson et al. | 317/235 |
| 3,463,974 | 8/1969 | Kelley et al. | 317/235 |

FOREIGN PATENTS OR APPLICATIONS

| | | | |
|---|---|---|---|
| 11,981 | 5/1968 | Japan | 317/235 |

OTHER PUBLICATIONS

IBM Tech. Discl. Bul. " Device Tailoring Procedure" by Smith, Vol. 7, No. 11, Apr. 1965 pg. 1100.
IBM Tech. Discl. Bul., " Metal- Oxide- Semiconductor Field- Effect Transistor Array for a Read- Only Store" by Dennard et al., Vol. 10, No. 1, June 1967, pgs. 77- 78.

*Primary Examiner*—Jerry D. Craig
*Attorney*—Maxwell James and Harold James

[57] ABSTRACT

Time delay devices, each an enhancement-type Insulated Gate Field Effect Transistor (IGFET) which comprises (1) a substrate entirely of one conductivity type having at the surface thereof source and drain regions of the opposite conductivity type, and (2) a conductive gate or gates, overlying but insulated from said substrate. If the device includes one gate, it may overlie either (a) part of the controlled region of the substrate between the source and drain regions, or (b) portions of the substrate remote from said controlled region. If the device includes plural gates, one gate has a floating potential and overlies the controlled region of the substrate, and the other biased gate overlies a portion of the substrate remote from said controlled region. When the source-drain circuit is biased conventionally, the application of a potential of the proper polarity to the gate will cause a charge to migrate slowly from the gate over the surface of the IGFET. As the charge covers the controlled region, it induces a change in conductivity type in the surface of the portion of the controlled region which it covers, thereby causing the source-drain circuit to become fully conductive after a predetermined delay. The delay is dependent upon ambient moisture and temperature, gate configuration, and resistivity of the IGFET's surface oxide layer. In one type of such devices, where generally a single gate bridges the controlled region of the substrate, a source-drain current appears immediately when a potential is applied to the gate; this current rises gradually to a saturation value. In another type of such devices, where generally a single gate does not bridge the controlled region, or where plural gates (with one floating) are used, the source-drain current begins only a given time after the application of a potential to the gate but then increases relatively rapidly to saturation value.

1 Claim, 12 Drawing Figures

(SINGLE TRANSVERSE GATE)

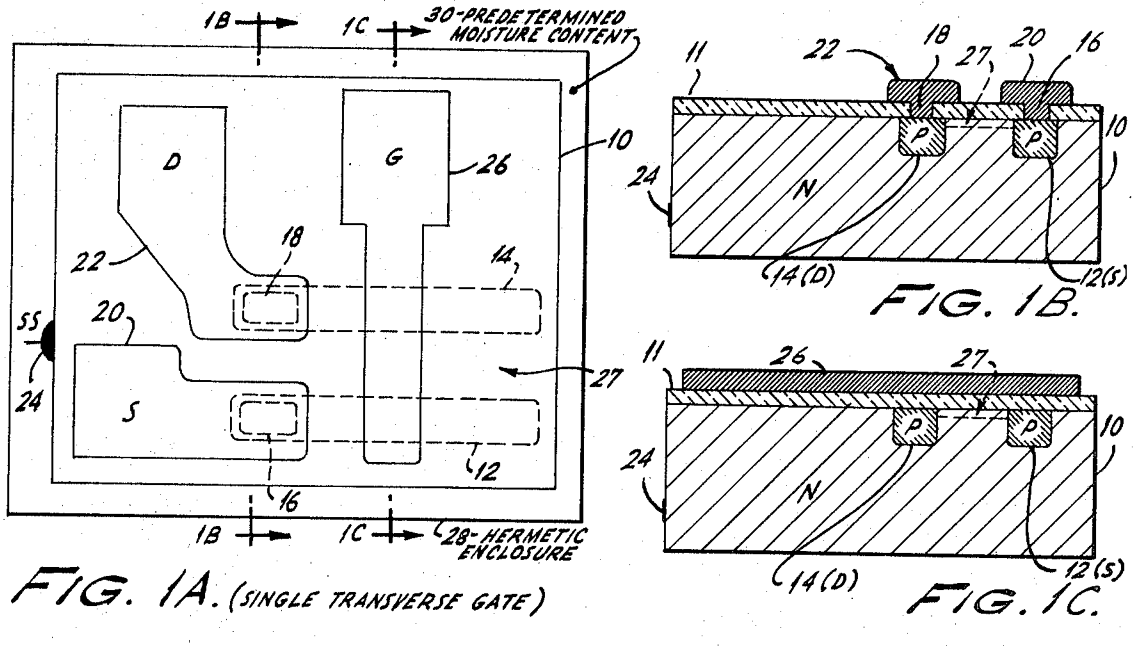
FIG. 1A. (SINGLE TRANSVERSE GATE) FIG. 1B. FIG. 1C.
FIG. 2. (MULTIPLE TRANSVERSE GATE)
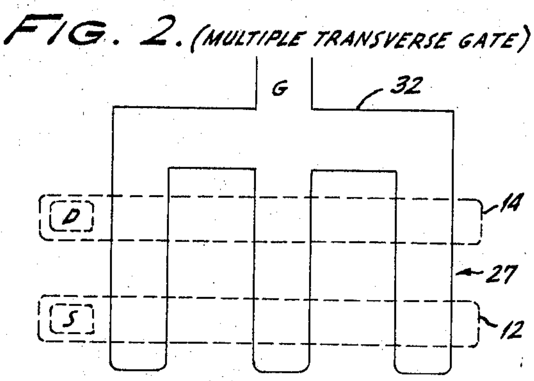
FIG. 3. (FLOATING GATE)
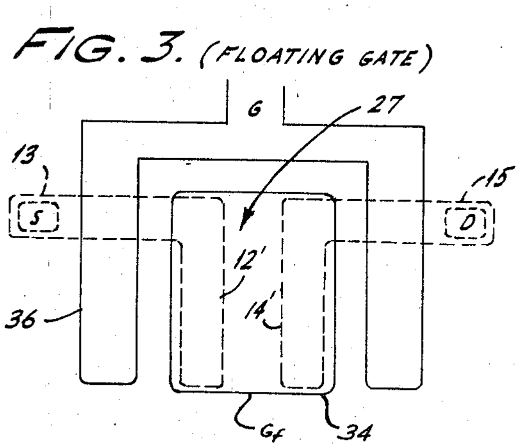
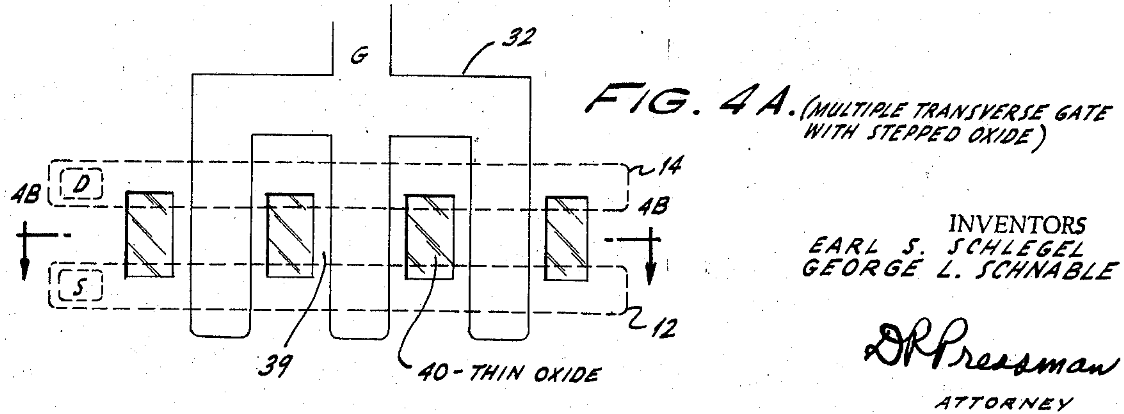
FIG. 4A. (MULTIPLE TRANSVERSE GATE WITH STEPPED OXIDE)
INVENTORS
EARL S. SCHLEGEL
GEORGE L. SCHNABLE
D R Pressman
ATTORNEY

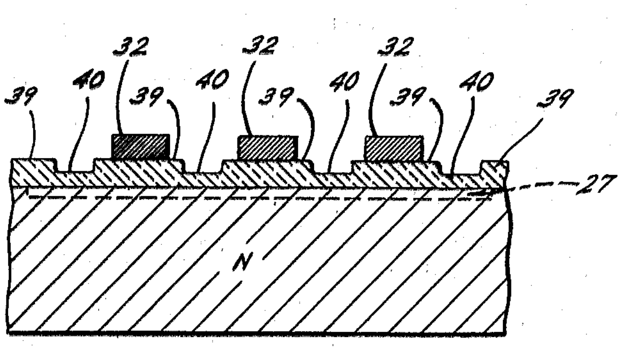
FIG. 4B.
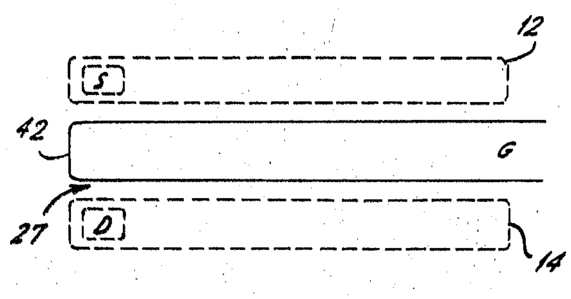
FIG. 5. (PARALLEL GATE)
FIG. 6. MULTIPLE TRANSVERSE REMOTE GATE
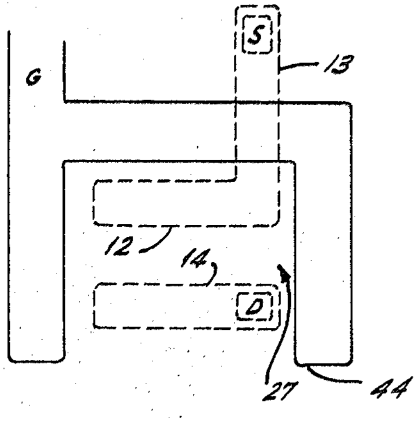
FIG. 7. GRAPH re FIGS. 1 & 2
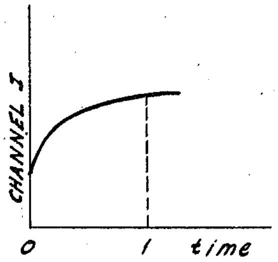
FIG. 9. UTILIZATION CIRCUIT
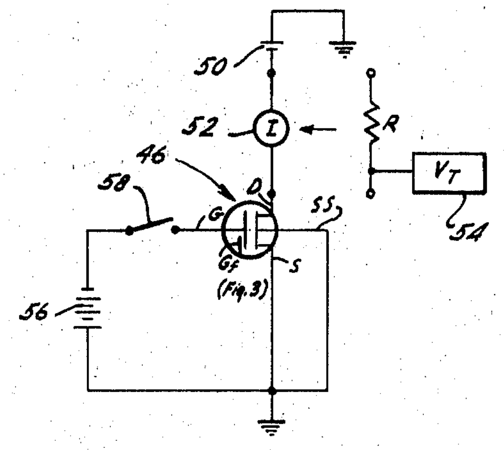
FIG. 8. GRAPH re FIGS. 3,4,5 & 6
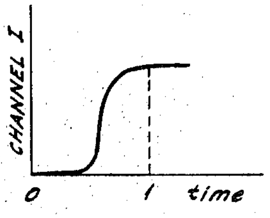
INVENTORS
EARL S. SCHLEGEL
GEORGE L. SCHNABLE
D R Pressman
ATTORNEY

TIME DELAY IGFETS

A copending application of the present inventors, Ser. No. 880,643, entitled "Time Delay IGFET," and filed simultaneously herewith, relates to a long time delay device comprising a specially constructed insulated gate field effect transistor (IGFET). The present invention relates to various types of IGFETs which are improvements of the IGFET described in said copending application.

The transistors of the present invention can provide a very long time delay (several minutes to several hours) without the use of a bulky charging capacitor, or other bulky, unreliable, and heavy means, by taking advantage of a novel mode of operation of a solid state device. The delay time can be adjusted by controlling various parameters of the transistor and its environment. Also, certain parameters can be adjusted to cause the transistor's output current either to begin (1) a given time after application of an input voltage and rise to a saturation value very shortly, or (2) immediately upon the application of an input voltage and thereafter rise slowly to a saturation value.

Several objects of the present invention are: (1) to provide time delay IGFETs having a variety of configurations, (2) to provide time delay IGFETs, the output current versus time characteristics of which can be selected as desired, (3) to provide time delay IGFETs, the sensitivity of which can be controlled by various electrode geometries, and (4) to provide time delay IGFETs in which no connection need be made to the substrate of the transistor and wherein a wider tolerance in electrode dimensions can be accommodated.

Further objects and advantages of the present invention will become apparent from a consideration of the ensuing description thereof.

DRAWINGS

FIG. 1A is a diagram, partially plan and partially schematic, of a time delay IGFET employing a single transverse gate.

FIGS. 1B and 1C are sectional views of the IGFET of FIG. 1A, taken along the lines 1B and 1C of FIG. 1A, respectively, in the direction indicated.

FIG. 2 is a diagram of part of a time delay IGFET with a multiple transverse gate.

FIG. 3 is a diagram of a part of a time delay IGFET with a transverse gate and a secondary gate.

FIG. 4A is a diagram of a part of a time delay IGFET with a multiple transverse gate and a dual oxide thickness.

FIG. 4B is a sectional view of the IGFET of FIG. 4A, taken along the line 4B of FIG. 4A in the direction indicated.

FIG. 5 is a diagram of a part of a time delay IGFET with a parallel gate.

FIG. 6 is a diagram of a part of a time delay IGFET with a multiple transverse remote gate.

FIGS. 7 and 8 are graphs which depict resultant channel current as a function of time for the IGFETs of FIGS. 1 and 2 and FIGS. 3 to 6, respectively.

FIG. 9 is a schematic diagram of a utilization circuit for the IGFETs of FIGS. 1 to 6.

FIGS. 1A–1C–IGFET WITH SINGLE TRANSVERSE GATE–DESCRIPTION

The IGFET shown in plan view in FIG. 1A and in sectional views in FIGS. 1B and 1C comprises a substrate or chip 10 which may be of N-type monocrystalline silicon. Substrate 10 includes source and drain regions 12 and 14 adjacent its surface. Regions 12 and 14 typically are formed by the diffusion of P-type impurities into spaced-apart portions of substrate 10. The surface portion of N-type substrate 10 between the entire facing edges of source and drain regions 12 and 14, designated controlled region 27, plays a vital part in operation of the IGFET, as discussed infra.

The entire surface of substrate 10 is covered by an insulating film 11, typically of silicon dioxide. Openings 16 and 18 are formed in the oxide covering to provide access to the source and drain regions. Metallic source and drain film contacts 20 and 22 are formed over the surface of the insulating film and are shaped so that one end of each contact reaches its respective region through one of the openings 16 and 18. An opposite, broadened end of each contact lies near the edge of substrate 10. A contact to substrate 10 is symbolically indicated at 24.

According to one aspect of the invention, a single transverse gate 26 is also formed over the surface of the insulating film. Gate 26 has a broadened end portion near the edge of chip 10 and a narrower portion which bridges the source and drain regions and the controlled region 27 of the substrate therebetween.

The chip is packaged within a hermetically sealed enclosure symbolically indicated at 28. The interior 30 of enclosure 28, which is the ambient for the chip, preferably has a predetermined moisture content. In accordance with well known practice, mutually insulated leads (not shown) are brought from the gate electrode 26, drain contact 22, source contact 20, and substrate contact 24 to the outside of enclosure 28.

The elements of the IGFET of FIG. 1 may be scaled approximately as indicated. The dimension of either side of the chip 10 may be about 20 mils and the oxide covering 11 may be about 1 micron thick. The remaining parameters and materials may be similar to those used for conventional IGFETS. For example the chip 10 may be N-type silicon, oriented <111>, and having a 5 ohm-cm. resistivity. The source and drain regions 12 and 14 are P-type and substantially degenerate ($10^{20}$ charge carriers per cc.). The surface contacts 20 and 22, as well as gate 26 may be films of aluminum about 8,000 Angstroms thick.

FIG. 1.—OPERATION

Initially, when no voltage is applied to gate 26, two rectifying junctions will exist in the substrate 10, one between drain region 14 and the portion of substrate 10 adjoining it, and the other between source region 12 and the portion of substrate 10 adjoining it. As is well known, the surface of controlled region 27 can be inverted from N-conductivity type to P-conductivity type by providing a sufficiently negative charge thereover. When the surface of region 27 is inverted, a P-type conductive channel is provided between the P-type source and drain regions.

Assume that a voltage source of about several volts magnitude is connected between the source and drain regions 12 and 14 by way of contacts 20 and 22, with the positive terminal of the voltage source connected to source contact 20 and the negative terminal of the voltage source connected to drain contact 22. No current flows from the voltage source due to the aforementioned rectifying junctions. If a voltage sufficiently negative with respect to substrate 10 (e.g., 100 volts for an IGFET with a 1 micron thick oxide layer) is applied to gate 26, the surface of region 27 under gate 26 immediately will be inverted by the field from the gate, providing a conductive channel under the portion of gate 26 which overlies region 27. This channel allows a current to flow between source and drain, as indicated in FIG. 7 at time 0.

The field provided by the potential difference between gate 26 and the substrate 10 also causes negative charges, i.e., ions such as hydroxyl ions, on the chip's surface to spread out slowly from gate 26. As the charges spread, they induce a change in conductivity type in the surface portions of the substrate adjacent the portion covered by gate 26, thereby causing the conductive channel to widen. As the channel widens, the resistance between the source and drain regions continuously decreases, allowing the channel current to increase gradually as indicated in FIG. 7.

At time 1, when the entire surface portion of region 27 is inverted, the source-drain current reaches a maximum, i.e., saturation, value.

The time required for the channel current to increase to saturation value is proportional to the horizontal dimension of the source and drain regions (i.e., the horizontal dimension of region 27), minus the horizontal dimension of the gate over region 27. This time is also proportional to ambient temperature and is inversely proportional to the magnitude of the surface resistivity of the chip's surface oxide, ambient moisture, and magnitude of gate voltage. These influences are discussed more fully in applicants' aforementioned copending application, which includes quantitative graphs, with reference to specifically different though related devices.

A device having the channel current curve of FIG. 7 can be used as a time delay device when coupled to a threshold type device which responds only to a current of greater than a predetermined magnitude. Alternatively such a device is useful in circuits where a continuously decreasing resistance is desirable, e.g., in an oscillator whose frequency is to be changed gradually over a long period of time, the device can be used in the circuit of such oscillator as a continuously decreasing resistance which changes the frequency of the oscillator.

FIG. 2—MULTIPLE TRANSVERSE GATE

FIG. 2 shows a partial view of time delay IGFET which has a multiple transverse gate. In FIG. 2, as well as in FIGS. 3 to 6, only the source and drain regions and the gate are shown; the chip and the source and drain contacts have been omitted in order to simplify the drawing.

In the device of FIG. 2 the source and drain regions 12 and 14 can be the same size as in FIG. 1, but preferably are lengthened to accommodate gate 32, which has three fingers bridging controlled region 27. The use of a gate with multiple bridging fingers provides a larger initial current and causes the channel current to rise more rapidly to saturation value. Such rise is faster than in the IGFET of FIG. 1 because the charge migrates from six edges rather than two.

FIG. 3—PLURAL GATES

Each of the IGFETS of FIGS. 1 and 2 provides the current characteristic of FIG. 7; each of the IGFETS of FIGS. 3, 4A and 4B, 5, and 6, on the other hand, provide the current characteristic of FIG. 8. As shown in FIG. 8, no source-drain current flows initially when a voltage is applied to the gate at time 0. After a delay time determined by the parameters of the IGFET and the applied voltages, the source-drain current appears and increases rapidly to a saturation value as indicated at time 1.

The transistor of FIG. 3 includes two gates: a first gate 36 (G) having two spaced vertical fingers, the upper ends of which are joined by a horizontal interconnecting arm, and a second or floating gate 34 ($G_f$) positioned between the fingers of gate 36 and over the source and drain regions 12′ and 14′ and controlled region 27. Gate 36 preferably is located so that the side and top edges of gate 34 are spaced equidistantly from the inner edges of the vertical arms and the bottom edge of the horizontal arm of gate 36, respectively. Source and drain regions 12′ and 14′ have extensions 13 and 15 which cross under the vertical fingers of gate 36 so that film contacts can be affixed to the source and drain regions without contacting either gate.

In operation, a bias source similar to that used with the device of FIG. 1 is connected between the source and drain. At time 0 (FIG. 8), a potential source similar to that used with FIG. 1 is applied between gate 36 and the substrate. This potential difference creates a field between gate 36 and the substrate which causes negative charges on the chip's surface to spread out slowly from gate 36. These charges reach the upper and side edges of floating gate 34 simultaneously, causing the potential of gate 34 to rise to that of gate 36. This in turn creates a field over the entire controlled region 27 between the source and drain regions, inverting the conductivity type of region 27. This allows the source-drain circuit to become conductive very rapidly, as indicated in FIG. 8.

The time required for the onset of conduction in the IGFET of FIG. 3 is dependent primarily on the spacing between gates 34 and 36, rather than on the orientation of a gate with respect to its source and drain regions. This is advantageous since, in production, it is easier to control accurately the separation between two gates, such as gates 34 and 36, than between a gate and its associated source and drain regions. This is because two gates are formed by the same procedure (e.g., photolithographic delineation) in the same chamber, whereas a gate and its associated source and drain regions are formed by different procedures (e.g., diffusion and photolithographic delineation) in different chambers. Thus delay time for a given applied gate voltage generally will tend to be more nearly the same in successively fabricated IGFETs of the type shown in FIG. 3.

FIGS. 4A and 4B—MULTIPLE TRANSVERSE GATE WITH STEPPED OXIDE

The IGFET of FIGS. 4A and 4B is similar to the IGFET of FIG. 2 except that the insulating film between the surface of the chip and gate 32 is substantially thicker in the nonshaded areas 39 than in the shaded areas, such as 40. The oxide thickness in the nonshaded areas 39 preferably is thicker than the oxide thickness in the IGFET of FIG. 2. The "thick" oxide should be thick enough (e.g., 1.5 microns) so that when the 100V gate voltage used with the IGFET of FIG. 2 is applied to the IGFET of FIGS. 4A and 4B, the gate voltage will not induce any conductive channels under the fingers of gate 32 in controlled region 27. Thus no source-drain current flows initially when a gate voltage is applied.

When the charge spreading from gate 32 appears over the thin-oxide portions 40, it induces conductive channels in the portions of region 27 under oxide portions 40, which are thin enough, e.g., 1.0 micron, so that the charge can invert the underlying portions of the substrate. This causes a source-drain current to begin flowing after a given interval, as indicated at time 1 in FIG. 8. As also indicated, the channel current then rises rapidly to a saturation value.

FIG. 5—PARALLEL GATE

In FIG. 5 the gate 42 is oriented parallel to region 27 and is thinner than the width of region 27. When a negative voltage is applied to gate 42, the surface of the substrate beneath the gate is inverted, but no current flows in the source-drain circuit, since the inverted portion of region 27 does not bridge region 27. A negative charge gradually spreads out from gate 42, causing the size of the inverted portion of region 27 to widen until it bridges region 27. This bridging provides a conductive channel through which a source-drain current can flow. That current rises extremely rapidly to saturation value.

FIG. 6—MULTIPLE TRANSVERSE REMOTE GATE

The IGFET of FIG. 6 includes a gate 44 which has two portions which do not overlie region 27 between source and drain regions 12 and 14 but are positioned adjacent opposite ends of region 27 and opposite sides of the source and drain regions. The source region 12 has an arm 13 crossing under the crosslimb of gate 44 so that a contact can be affixed to the source without contacting gate 44.

When a negative voltage is applied between gate 44 and the substrate, the portions of the substrate under gate 44 are inverted immediately, but no source-drain current flows since the inverted portions do not at that time bridge region 27. As the negative changes from gate 42 spread out over the surface of the chip, the inverted portions of the substrate widen until they bridge the portion of the substrate between the source and drain regions, thereby creating a source-drain current. This current increases to saturation value as the charges spread over region 27. Due to the positioning of gate 44 with respect to source and drain 12 and 14, the time between application of a gate voltage and the onset of source-drain current, as well as the time for the source-drain current to reach saturation value, is greater in the IGFET of FIG. 6 than in the IGFET of FIG. 5.

FIG. 9—UTILIZATION CIRCUIT

FIG. 9 shows a utilization circuit for the time delay IGFETs of the present invention. The IGFET is indicated symbolically at 46; its gate (G), source (S), drain (D), and substrate (SS) are lettered appropriately.

The IGFET of FIG. 3, which includes a second gate 36 and no substrate connection, can be illustrated schematically by substituting a symbolic secondary gate ($G_s$) and eliminating the substrate connection.

The source-drain circuit of IGFET 46 is biased by a potential source indicated by a battery 50; the positive terminal of battery 50 serves as a reference (ground) terminal. The source S of IGFET 46 is connected to ground and the drain D thereof is connected to the negative terminal of battery 50 by way of a current responsive means 52, which may be a current indicating device such as an ammeter, or a threshold current responsive device, such as a relay. Voltage responsive means can be employed in lieu of means 52 if a load resistor (R) and a connected voltage responsive means 54 are substituted for means 52 as indicated. Means 54 may be a voltage indicating device, such as a voltmeter, or a voltage threshold device, such as a trigger circuit.

The gate of IGFET 46 is energized from a second voltage source 56, which can be the same source as source 50. The positive terminal of source 56 is connected to ground and the negative terminal thereof is connected to a switch 58, which is arranged to couple source 56 to the gate of IGFET 46. The substrate (or secondary gate) of IGFET 46 also is connected to ground.

While various embodiments of the invention are indicated in the several figures of drawings, these are exemplary only, since various other configurations according to the invention can be readily envisioned. For example the source and drain regions need not have the rectangular configurations indicated, but can have other shapes such as square, circular, etc. Also the orientation of the gate need not be normal to the source and drain regions as indicated in FIG. 1 but can have an oblique orientation. In the transistor of FIG. 3 the shape of the two gates 34 and 36 can be varied to provide fewer or greater gaps and different gap shapes, and the location of the two gates can be changed to provide different spacings between the gap(s) and region 27. In the transistor of FIG. 5, gate 42 can be provided with an additional vertically oriented arm which bridges region 27 and the source and drain regions and which is joined to the single horizontal arm shown so as to provide a cruciform-shaped gate; the resultant device will have the current v. time characteristic of FIG. 7.

We claim:

1. A time delay device comprising:

a body of monocrystalline semiconductive material having a major surface and containing spaced-apart source and drain regions of one conductivity type which extend from respective portions of said surface into said body to a given depth, the entire portion of said body between said source and drain regions being of a conductivity type opposite said one type, whereby rectifying junctions exist between said portion and said source and drain regions, an insulating film covering said surface of said body, a given part of said film overlying said portion of said body between said source region and said drain region, a first conductive member overlying only a portion of said given part of said insulating film, said source and drain regions having parallel opposing edges at the surface of said body, the surface of said portion of said body between said source and drain regions being elongated, the major edges thereof being contiguous said opposing edges of said source and drain regions, respectively, said first conductive member being elongated and crossing over said source and drain regions and the portion of said substrate therebetween, the portion of said given part of said insulating film which is covered by said first member having a greater thickness than another portion of said given part of said insulating film.

* * * * *